United States Patent [19]
Robertson et al.

[11] Patent Number: 5,805,606
[45] Date of Patent: Sep. 8, 1998

[54] CACHE MODULE FAULT ISOLATION TECHNIQUES

[75] Inventors: Paul Gordon Robertson; Robert Lisin Tung, both of Austin, Tex.

[73] Assignee: International Business Machines Corporation, Armonk, N.Y.

[21] Appl. No.: 816,627

[22] Filed: Mar. 13, 1997

[51] Int. Cl.$^6$ ..................................................... G06F 11/00
[52] U.S. Cl. ........................................................... 371/21.1
[58] Field of Search .................................. 371/21.1, 21.2, 371/21.3, 21.6; 395/182.03, 182.05, 182.06; 365/201

[56] References Cited

U.S. PATENT DOCUMENTS

| | | |
|---|---|---|
| 3,553,654 | 1/1971 | Crane . |
| 5,099,485 | 3/1992 | Bruckert et al. . |
| 5,416,921 | 5/1995 | Frey et al. . |
| 5,502,728 | 3/1996 | Smith, III . |
| 5,511,224 | 4/1996 | Tran et al. . |
| 5,551,004 | 8/1996 | McClure . |
| 5,561,760 | 10/1996 | Ferris et al. . |
| 5,588,111 | 12/1996 | Cutts, Jr. et al. . |
| 5,592,632 | 1/1997 | Leung et al. . |
| 5,613,077 | 3/1997 | Leung et al. . |

OTHER PUBLICATIONS

Second–Level Shared Cache Implementation for Multiprocessor Computers with a Common Interface for the Second–Level Shared Cache and the Second–Level Private Cache, IBM Technical Disclosure Bulletin, vol. 33, No. 11, Apr. 1991, pp. 362–365.

Power Managed Second–Level Cache Control, IBM Technical Disclosure Bulletin, vol. 39, No. 04, Apr. 1996, pp. 79–82.

*Primary Examiner*—Vincent P. Canney
*Attorney, Agent, or Firm*—Robert V. Wilder

[57] ABSTRACT

A process and implementing system is provided for conducting a memory test for isolating and identifying failed cache memory modules in a memory subsystem of a computer system. The methodology initially selects 303 a block of memory which is twice the size of the cache 105 being tested. The cache 105 is then disabled 305 and a first test is performed 307 on the selected block of to isolate byte addresses of individual bit failures. If bit failures are detected 308, the appropriate byte address is mapped 310 and the test is ended 321. If no bit errors are detected in the first test, the cache is enabled 309 and a second test is performed and the block is tested 311 for failures. Any detected failures are assumed to be cache failures and the appropriate byte address is mapped 315. The cache is again disabled 317. An appropriate message is then displayed 319 to indicate the results of the testing.

22 Claims, 3 Drawing Sheets

CACHE MODULE FAULT ISOLATION TECHNIQUES

FIELD OF THE INVENTION

The present invention relates generally to information processing systems and more particularly to an improved methodology for testing memory systems.

BACKGROUND OF THE INVENTION

Computer systems, including personal computers or "PCs", generally include a CPU casing or box, which, in turn, is comprised of a series of electronic circuit boards or cards. The circuit boards or cards each typically have integrated circuits (ICs) or "chips" mounted on the boards and the ICs are connected together and to each other as well as to other components on other boards in the computer system. The mounted ICs are also usually part of subsystems within the computer system, such as display subsystems, input-output subsystems and memory subsystems, all of which must function together for the computer system or the PC to work properly.

As a PC is assembled at a factory, the component parts including the ICs are typically tested many times before being mounted on a circuit card and connected to the remainder of the circuits within the computer system. Similarly, even after being mounted, cards are tested to insure against defects in the component itself or within a subsystem of the computer system.

Component or subsystem defects may result from many sources. For example, an individual IC, may cause a subsystem fault or defect when the IC is assembled on to the circuit card even though the IC had passed earlier testing as an individual component. Defects may be created during shipment of an IC or merely through normal handling during the assembly process. Even after a system is assembled and tested, and the unit is delivered to a customer, something may occur during the physical transporting of the unit or even during customer set-up that will cause the computer unit not to function properly. For example, a static electrical discharge or grounding may occur at a customer's installation site as the customer is installing the unit and as a result, one or more of the ICs may be ruined and replacement would be required. Thus, defects can occur as a result of manufacturing assembly, component problems or customer failure returns.

In repairing such systems, the initial task is to isolate and locate the faulty component. In a complex CPU card design, it is essential to be able to quickly identify defects. Quick isolation will speed corrective action. That task is relatively complex in view of the many thousands of connections and hundreds of components even in a small computer system or other information processing system. Some components lend themselves to automatic fault isolation in connection with self-testing programs which may be run on the units to isolate and identify specific areas where a fault has been located. That process is typically done by running Power On Self Test (POST) routines when a system is initially powered on.

One particular area where improvement is needed is in the memory subsystem. Cache memory, including Level-2 (L2) Cache and system memory integrity can be tested using a POST, but determining whether the problem is system memory or L2 is a difficult task. A technique or method which would be capable of isolating POST failures to a specific L2 module is therefore needed in order to quickly isolate faulty components or modules and have such modules replaced. Such a method would allow the defect module to be replaced with only minimum time and expense.

SUMMARY OF THE INVENTION

A method and implementing system are provided in which is selectively operable to automatically and systematically test a memory subsystem, including system memory and cache memory, for defects and provide an indicium representative of the module in system memory or cache memory that has failed.

BRIEF DESCRIPTION OF THE DRAWINGS

A better understanding of the present invention can be obtained when the following detailed description of a preferred embodiment is considered in conjunction with the following drawings, in which.

DETAILED DESCRIPTION

The various methods disclosed herein may be implemented within a typical computer system or workstation or other electronic apparatus which includes one or more subsystems. In the present example, a memory subsystem within a computer system is discussed for purposes of illustrating the methodology disclosed herein. Since the workstation or computer system within which the present invention is implemented is, for the most part, generally known in the art and composed of electronic components and circuits which are also generally known to those skilled in the art, circuit details beyond those shown in FIG. 1, will not be explained to any greater extent than that considered necessary as illustrated, for the understanding and appreciation of the underlying concepts of the present invention and in order not to obfuscate or distract from the teachings of the present invention.

Figure 1:
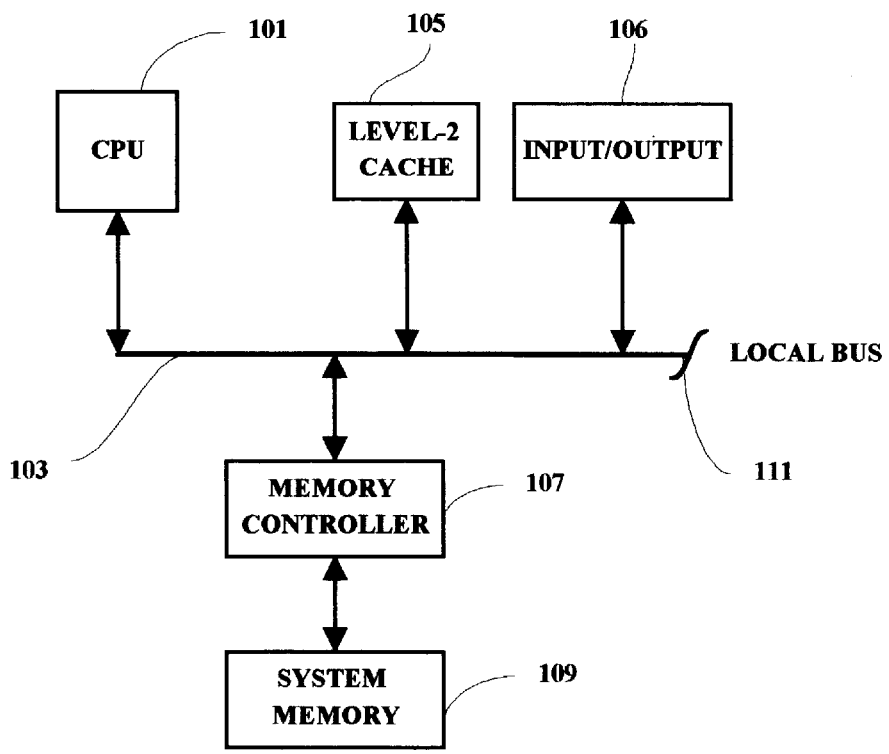
FIG. 1 is a simplified block diagram of a portion of an exemplary computer system including a memory subsystem.

With specific reference to FIG. 1, there is shown a central processing unit (CPU) 101 connected to a local bus 103. The local bus 103 is connected to a Level-2 (L2) cache unit 105 and also through a memory controller 107 to a system memory 109. The local bus 103 is also coupled to system Input/Output devices 106, such as mouse devices, keyboards, disk drives and/or other medium reading devices such as CD readers, display devices, network connections and printers. The local bus 103 is arranged for connection 111 to other subsystems and computer units from the local bus 103, and also through bridge circuits to other bus configurations. In the present example however, only the illustrated memory subsystem comprising the memory controller 107, the system memory 109 and the L2 cache 105 will be referred to in explaining the memory test methodology disclosed herein.

Figure 2:
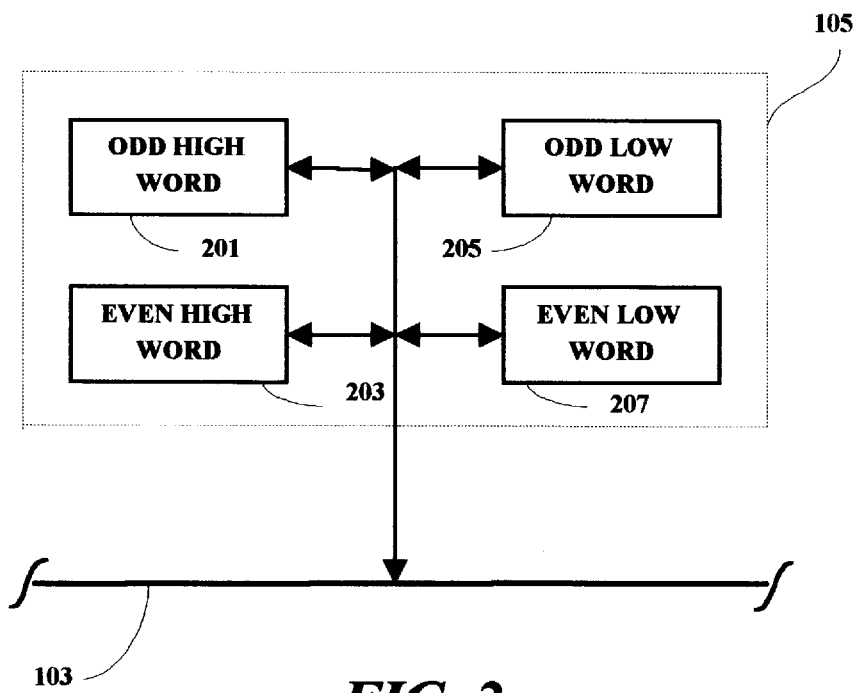
FIG. 2 is a simplified block diagram of the cache memory portion of the system illustrated in FIG. 1.

In FIG. 2, the local bus 103 is shown connected to several exemplary modules within the L2 cache memory unit 105. The L2 cache 105 is designed to hold an even word and an odd word and each module within the L2 cache is designed to either a high byte or a low byte of the corresponding word. For example, in the four modules illustrated, a first module 201 is designated to hold a high byte of an odd word. Similarly, module 205 holds a low byte of the odd word. Module 203 holds the high byte of an even word and module 201 holds a low byte of the even word.

Figure 3:
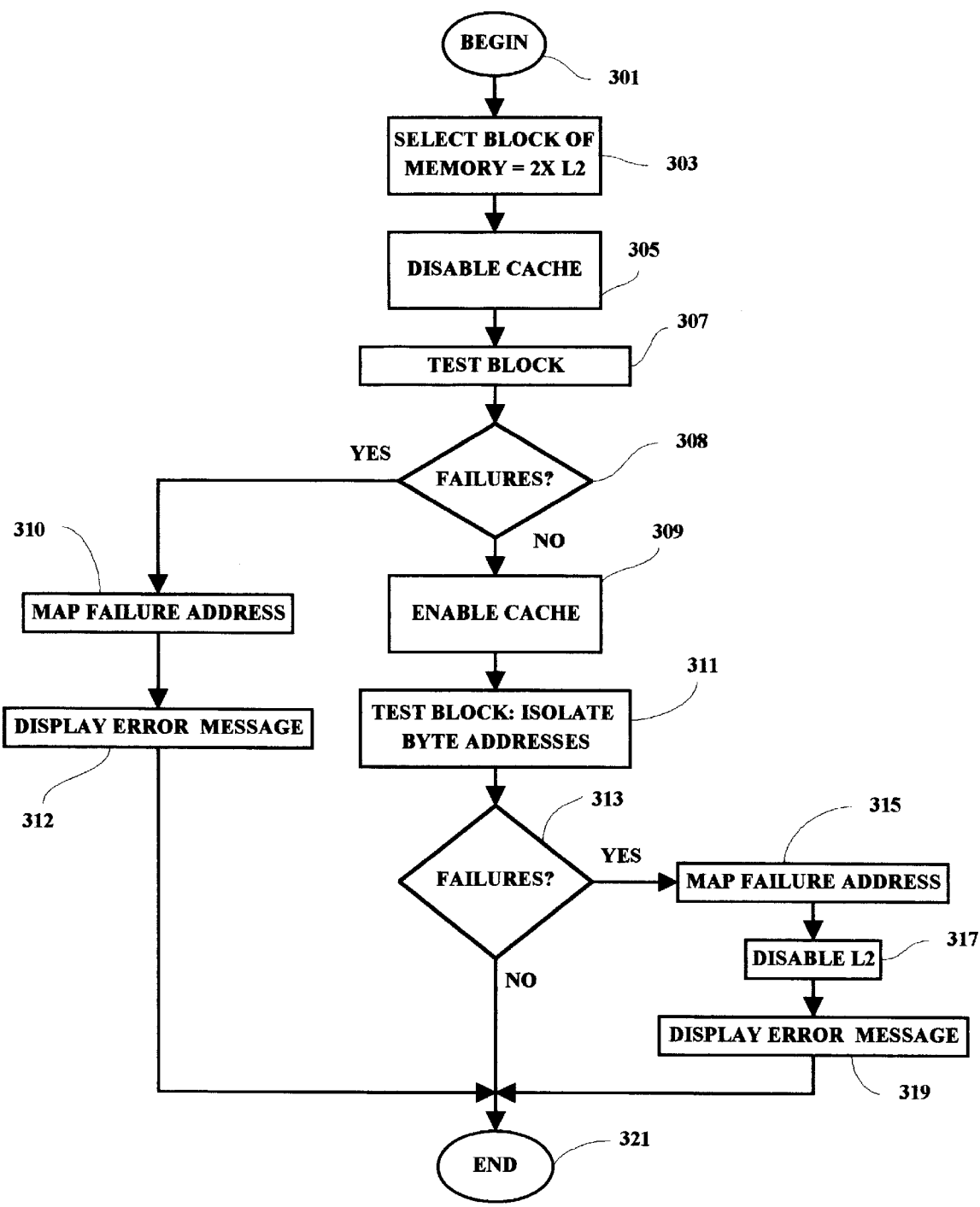
FIG. 3 is a flow chart illustrating an application of the disclosed methodology as implemented in the exemplary embodiment presented herein.

The method disclosed herein to detect which L2 module is defective is illustrated in FIG. 3. Initially when the procedure is begun 301, a block of memory addresses is selected 303. In the present example, a 1 Mbytes of L2 is installed in the system under test, and a 2 Mbytes block of addresses is selected to insure that all of the L2 cache is tested. The number of addresses selected could also be greater than twice the size of the L2 cache.

Next, the L2 cache 105 is disabled 305 and a first test 307 is performed on the individual byte addresses in the block using a POST routine capable of isolating any single bit failures to particular byte addresses. If failures are detected 308 during the first test 307, then the failure addresses are mapped 310 and an error message may be displayed 312 and the routine is ended 321. If there are no bit failures detected 308 as a result of the first testing procedure 307, the L2 cache is enabled 309 and a second test is performed and the test block is again thoroughly tested 311 to isolate bit failures to particular byte addresses. At that point, any new failures discovered can be assumed to be L2 failures. Next, if failures are detected 313, the failure address is mapped 315 to the physical module of L2 in which the failure occurred. This map is design dependent and requires a custom look-up table. In the present example, if an odd address had a POST failure in a byte located in a high word, then the ODD HIGH WORD L2 module 201 will be defective and be identified for replacement. Next, L2 is disabled 317, an error message may be displayed 319 and the process is ended 321. If no failures had been detected 313, then the process would end 321 directly following the check for failures 313.

Figure 4:
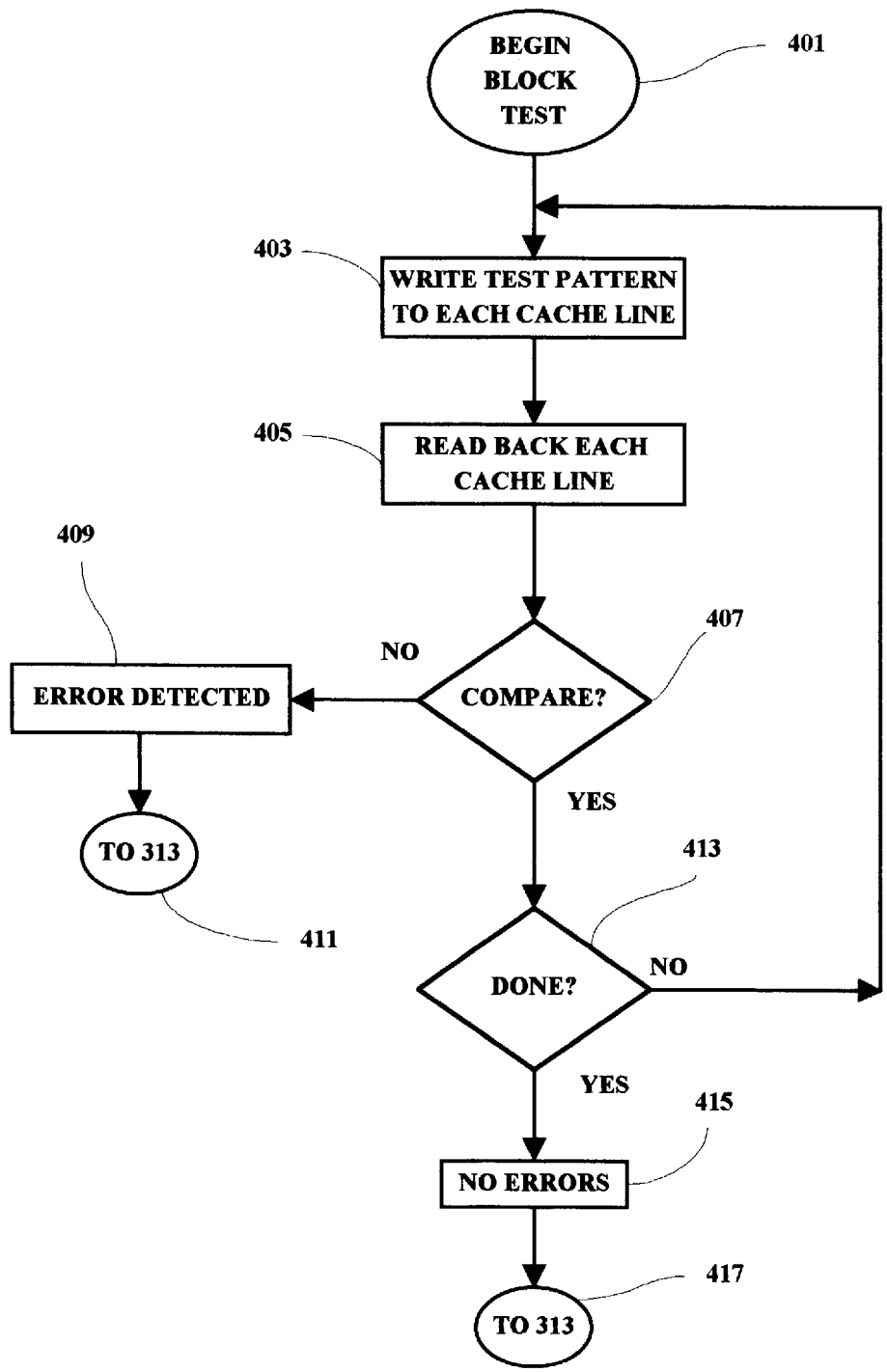
FIG. 4 is a flow chart illustrating a simplified cache memory testing process.

In FIG. 4, a simplified flow chart is shown illustrating an exemplary cache testing process such as the block testing process 311 of FIG. 3. When block 311 calls for a test, a block test is initiated 401 and designated test patterns are written to each cache line 403. Next, each cache line is written back 405 and compared 407 with the input test pattern. If the comparison matches, a check is made 413 to determine if all the cache lines have been tested. If all of the cache lines have been tested a "no errors" status is attained and the process returns a "NO" response to block 313. As illustrated, the test loop will continue until each cache line has been tested. When an error is detected and the read out does not compare 407 with the test pattern written into a cache line, an "error detected" status is attained 409 and a "YES" failure response is returned to block 313.

The method and apparatus of the present invention has been described in connection with a preferred embodiment as disclosed herein. Although an embodiment of the present invention has been shown and described in detail herein, along with certain variants thereof, many other varied embodiments that incorporate the teachings of the invention may be easily constructed by those skilled in the art, and either provided as an isolated program, or included as a routine or integrated and hard-wired into a CPU or other larger system integrated circuit or chip. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method for conducting a check memory test for testing system memory including a cache memory, said method comprising:

selecting a reference block of memory larger than the cache memory size;

effecting a first disabling of the cache memory;

performing a first test of said reference block for bit failures;

enabling the cache memory if no bit failures detected;

performing a second test of said reference block for bit failures; and mapping appropriate byte addresses for any bit failures detected in said second test.

2. The method as set forth in claim 1 wherein said cache memory is of a first size and said reference block is selected to be of a second size, said second size being at least twice said first size.

3. The method as set forth in claim 1 and following said mapping, said method further including:

effecting a second disabling of said cache memory.

4. The method as set forth in claim 3 and following said second disabling, said method further including:

providing an error indicium representative of an existence of bit failure when a bit failure has been detected.

5. The method as set forth in claim 4 wherein said indicium is presented on a display device.

6. The method as set forth in claim 5 wherein said indicium is representative of a byte address of a byte containing a detected bit failure.

7. The method as set forth in claim 2 and following said mapping, said method further including:

effecting a second disabling of said cache memory.

8. The method as set forth in claim 7 and following said second disabling, said method further including:

providing an error indicium representative of an existence of bit failure when a bit failure has been detected.

9. The method as set forth in claim 8 wherein said indicium is presented on a display device.

10. The method as set forth in claim 9 wherein said indicium is representative of a byte address of a byte containing a detected bit failure.

11. The method as set forth in claim 1 and, following said performing of said first test, said method further including:

mapping appropriate byte addresses for any bit failures detected in said first test; and ending said check memory test.

12. A storage medium including machine readable indicia, said storage medium being selectively coupled to an input device, said input device being coupled to a processing circuit, said input device being selectively operable to read said machine readable indicia and provide program signals representative thereof, said program signals being effective to cause said processing circuit to conduct a check memory test to test a memory subsystem which includes a cache, by performing the steps of:

selecting a reference block of memory larger than the cache memory size;

effecting a first disabling of the cache memory;

performing a first test of said reference block for bit failures;

enabling the cache memory if no bit failures detected;

performing a second test of said reference block for bit failures; and mapping appropriate byte addresses for any bit failures detected in said second test.

13. The storage medium as set forth in claim 12 wherein said cache memory is of a first size and said reference block is selected to be of a second size, said second size being at least twice said first size.

14. The storage medium as set forth in claim 12 and following said mapping, said program signals being further effective for:

effecting a second disabling of said cache memory.

15. The storage medium as set forth in claim 14 and following said second disabling, said program signals being further effective for:

providing an error indicium representative of an existence of bit failure when a bit failure has been detected.

16. The storage medium as set forth in claim 15 wherein said indicium is presented on a display device.

17. The storage medium as set forth in claim 16 wherein said indicium is representative of a byte address of a byte containing a detected bit failure.

18. The storage medium as set forth in claim 13 and following said mapping, said program signals being further effective for:

effecting a second disabling of said cache memory.

19. The storage medium as set forth in claim 18 and following said second disabling, said program signals being further effective for: providing an error indicium representative of an existence of bit failure when a bit failure has been detected.

20. The storage medium as set forth in claim 17 wherein said indicium is presented on a display device.

21. The storage medium as set forth in claim 20 wherein said indicium is representative of a byte address of a byte containing a detected bit failure.

22. The storage medium as set forth in claim 12 and, following said performing of said first test, said program signals being further effective for:

mapping appropriate byte addresses for any bit failures detected in said first test; and ending said check memory test.

* * * * *

UNITED STATES PATENT AND TRADEMARK OFFICE
CERTIFICATE OF CORRECTION

PATENT NO. : 5,805,606
DATED : Sept. 8, 1998
INVENTOR(S) : Robertson et al

It is certified that error appears in the above-identified patent and that said Letters Patent is hereby corrected as shown below:

Column 3, line 4: change "201" to --207--.

Column 3, line 39, change "written" to --read--.

Signed and Sealed this

Ninth Day of February, 1999

Attest:

Attesting Officer

*Acting Commissioner of Patents and Trademarks*